United States Patent [19]

Eklund

[11] Patent Number: 4,874,714
[45] Date of Patent: Oct. 17, 1989

[54] METHOD OF MAKING LATERALLY ORIENTED SCHOTTKY DIODE

[75] Inventor: Robert H. Eklund, Plano, Tex.

[73] Assignee: Texas Instruments Incorporated, Dallas, Tex.

[21] Appl. No.: 201,506

[22] Filed: Jun. 2, 1988

[51] Int. Cl.⁴ .................... H01L 21/22; H01L 21/265
[52] U.S. Cl. ......................................... 437/39; 437/34; 437/40; 437/41; 437/51; 437/175; 437/904
[58] Field of Search .................... 437/904, 34, 56, 175, 437/39, 40, 41, 51, 56, 57, 228; 357/15, 23.5, 42

[56] References Cited

U.S. PATENT DOCUMENTS

| | | | |
|---|---|---|---|
| 4,063,964 | 10/1977 | Peressimi et al. | 437/39 |
| 4,260,431 | 4/1981 | Piotrowski | 437/175 |
| 4,278,985 | 7/1981 | Stobbs | 357/15 |
| 4,300,152 | 11/1981 | Lepselter | 357/15 |
| 4,310,362 | 1/1982 | Roche et al. | 357/15 |
| 4,357,178 | 11/1982 | Bergeron et al. | 437/175 |
| 4,425,379 | 1/1984 | Vora et al. | 437/39 |
| 4,450,021 | 5/1984 | Batra et al. | 437/904 |
| 4,476,476 | 10/1984 | Yu et al. | 357/23.13 |
| 4,590,664 | 5/1986 | Prentice et al. | 437/904 |
| 4,638,551 | 1/1987 | Einthoven | 437/39 |

Primary Examiner—Brian E. Hearn
Assistant Examiner—Tom Thomas
Attorney, Agent, or Firm—Rodney M. Anderson; Melvin Sharp

[57] ABSTRACT

A Schottky diode (12) whose fabrication is adapted to a CMOS process is disclosed. The Schottky diode (12) is formed in an N− well (24). A spacer (40) is formed over the N− well (24), then an N+ region (52) is implanted along one side of the spacer (40). The spacer (40) is structurally similar to a CMOS transistor (14, 16) gate structure (38), and the N+ implantation process is the same one which is used to implant N+ source and drain regions (53) in an NMOS transistor (16). A guard ring (60) is implanted using the same process steps which are used to implant source and drain regions (56) for a PMOS transistor (14). A silicide (62) contacts the N− well region (24) along an opposing side of the spacer (40) to form a rectifying junction. This silicide (62) is additionally used in the CMOS transistors (14, 16) to lower contact resistance in conductive semiconductor regions (38, 53, and 56).

12 Claims, 3 Drawing Sheets

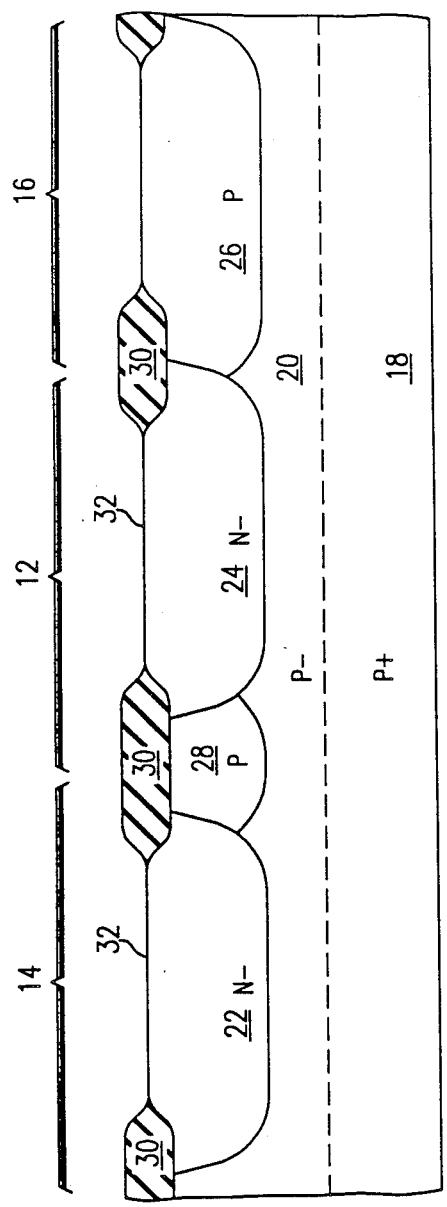
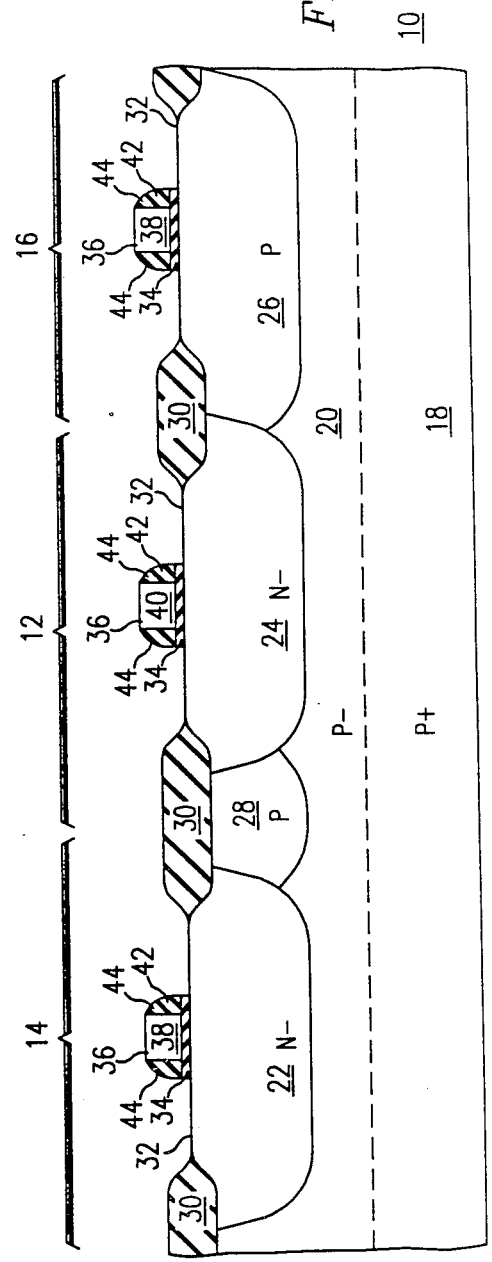

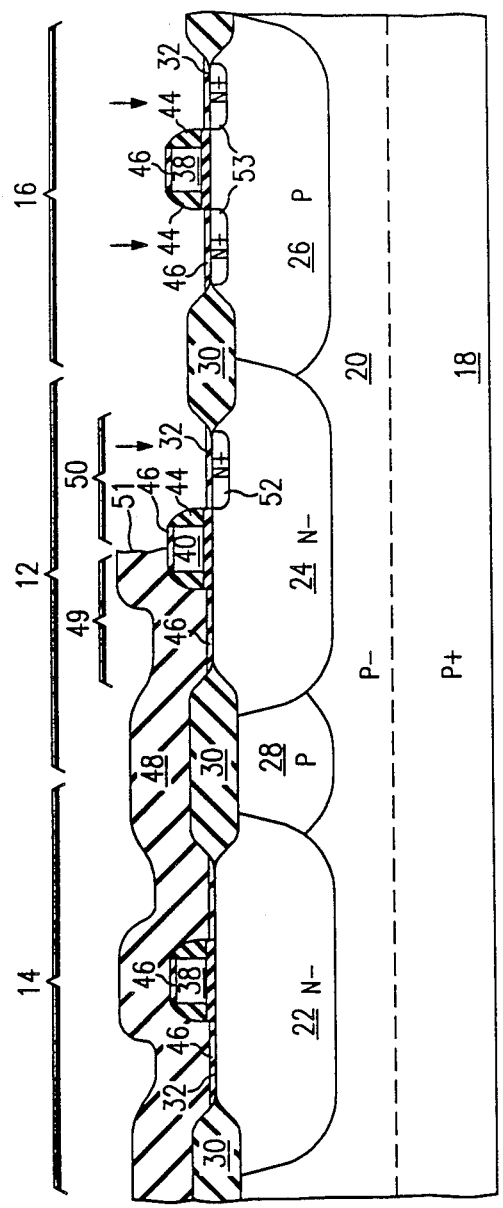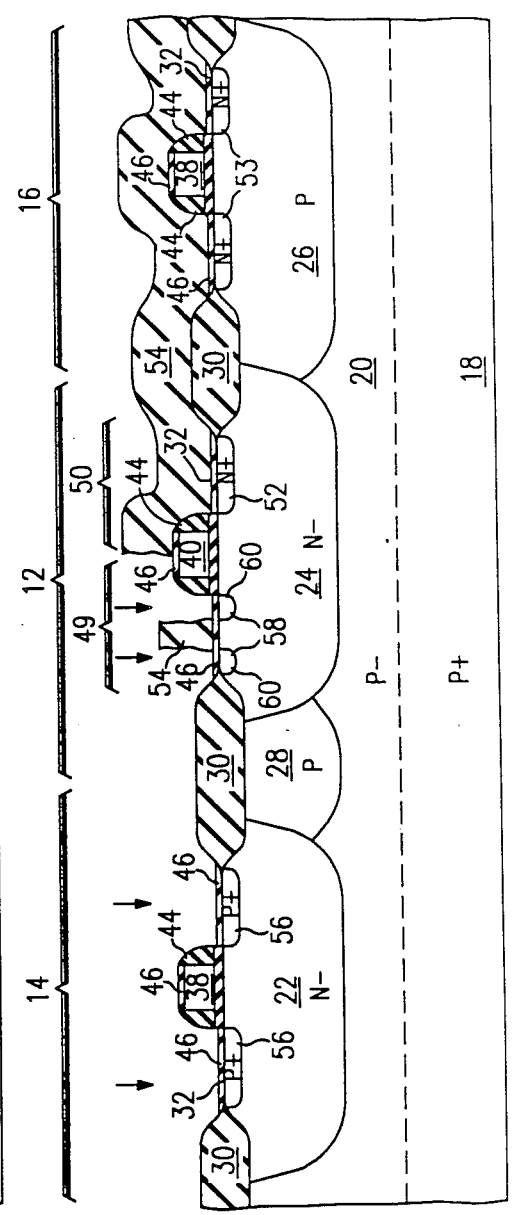

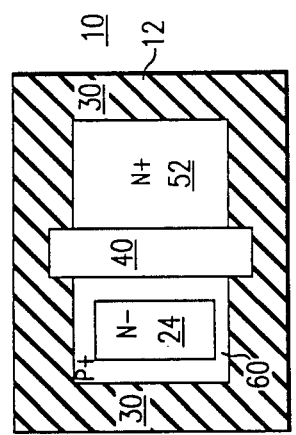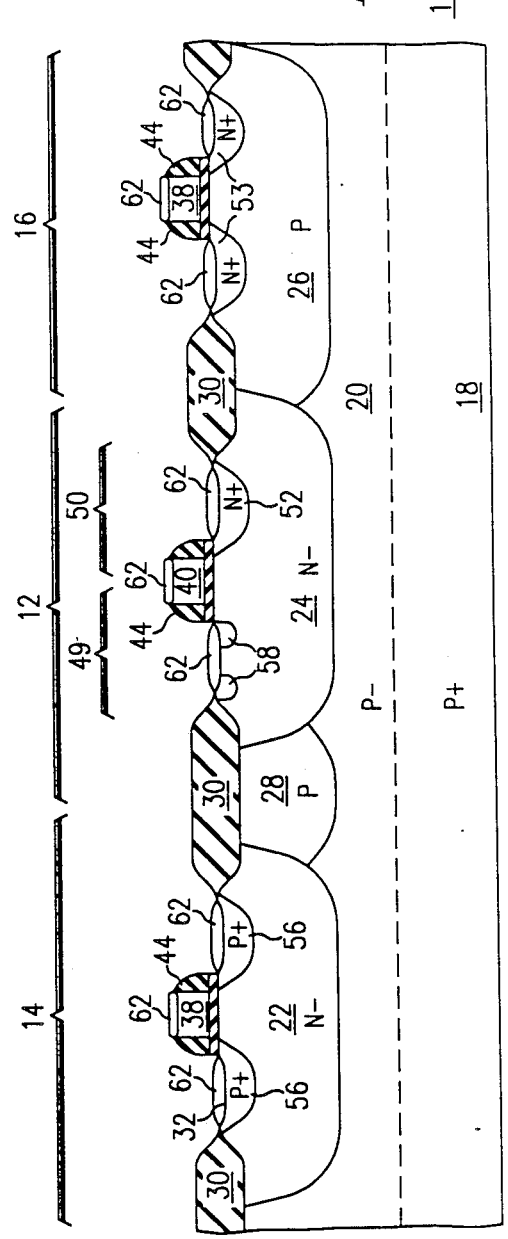

METHOD OF MAKING LATERALLY ORIENTED SCHOTTKY DIODE

TECHNICAL FIELD OF THE INVENTION

The present invention relates generally to semiconductor devices. More specifically, the present invention relates to Schottky diodes and to the processes used in their fabrication.

BACKGROUND OF THE INVENTION

Conventional Schottky diodes, also known as metal-semiconductor diodes are associated with bipolar fabrication processes. In such processes, a Schottky diode is oriented vertically. For example, a Schottky diode cathode may be formed at a buried N+ layer, which is similar to a subcollector region in an NPN bipolar transistor. This "subcollector" region may be coupled to a semiconductor surface by an N+ region, which is similar to a deep collector in an NPN bipolar transistor. This "deep collector" region couples to a contact. An N− semiconducting layer may reside between the buried N+ "subcollector" layer and the semiconductor surface. A metal layer may then reside on the semiconductor surface in contact with this N− semiconductor layer. A contact couples to the metal layer. Consequently, the boundary between the metal layer and the N− layer forms a rectifying junction, the boundary between the contact and the N+ "deep collector" region forms an ohmic junction, and the resulting Schottky diode is vertically oriented.

Since CMOS processes typically do not include similarly doped buried layers, the conventional Schottky devices may be adapted to a CMOS process only at great expense and complication. Consequently, a need exists for a laterally oriented Schottky diode that conforms to typical CMOS processes.

SUMMARY OF THE INVENTION

Accordingly, it is an advantage of the present invention that an improved Schottky diode is provided which may be oriented laterally and which easily conforms to typical CMOS processes.

Another advantage of the present invention is that a Schottky diode is provided that may be fabricated in a CMOS device without the addition of process steps not otherwise needed to fabricate a CMOS device.

Still another advantage of the present invention is that a lateral Schottky diode is provided in which series resistance is minimized and remains relatively constant from diode to diode.

The above and other advantages of the present invention are carried out in one form by a metal-semiconductor diode having a substrate with semiconductor surface areas. One of the surface areas of the substrate has a well region. This well region contains a first conductivity type dopant. In addition, a spacer resides on the substrate overlying a portion of this well region. The well region additionally contains an ohmic contact region on a first side of the spacer. The ohmic contact region contains another first conductivity type dopant. However, the concentration of the first conductivity type dopant in the ohmic contact region is greater than the concentration of the first conductivity type dopant in other portions of the well region. Moreover, a metallic layer resides in contact with the well region at a second side of the spacer, which opposes the first side of the spacer. A boundary which exists between the metallic layer and the well region forms a rectifying junction.

The above and other advantages of the present invention are carried out in another form by a process in which a metal-semiconductor diode is manufactured in a substrate which has semiconducting surface areas. The process forms a well region in the substrate at one of the surface areas. This well region contains a first conductivity type dopant. A spacer is formed on the substrate overlying a portion of the well region. An ohmic contact region is formed in the well region along a first side of the spacer. The ohmic contact region contains another first conductivity type dopant. However, the level of concentration of the first conductivity type dopant in the ohmic contact region is greater than the concentration of the first conductivity type dopant in other areas of the well region. A metallic layer is formed overlying and in contact with the well region along a second side of the spacer so that a boundary between the metallic layer and the well region is a rectifying junction.

BRIEF DESCRIPTION OF THE DRAWINGS

A more complete understanding of the present invention may be derived by referring to the detailed description and claims when considered in connection with the accompanying FIGURES, wherein like reference numbers refer to similar items throughout the FIGURES, and:

FIG. 1 shows a schematic, cross-sectional side view of the present invention at a first stage of fabrication;

FIG. 2 shows a schematic, cross-sectional side view of the present invention at a second stage of fabrication;

FIG. 3 shows a schematic, cross-sectional side view of the present invention at a third stage of fabrication;

FIG. 4 shows a schematic, cross-sectional side view of the present invention at a fourth stage of fabrication;

FIG. 5 shows a schematic, top view of a portion of the present invention at a fifth stage of fabrication; and FIG. 6 shows a schematic, cross-sectional side view of the present invention at a sixth stage of fabrication.

DETAILED DESCRIPTION OF THE PREFERRED EMBODIMENT

The present invention includes a laterally oriented Schottky, or metal-semiconductor, diode and a process for fabricating a laterally oriented Schottky diode in a CMOS device. The Schottky diode is useful in many circuits as a protective device. Schottky diodes have a lower barrier height, which causes such Schottky diodes to exhibit a low turn-on voltage. A Schottky diode may exhibit a turn-on voltage of around 200 millivolts, which is significantly lower than a typical 700 millivolts turn-on voltage characteristic of a silicon PN junction. Such Schottky devices may advantageously be coupled to inputs of NMOS transistors to protect against negative overshoot of input signals. The low turn-on voltage of the Schottky diodes causes such diodes to conduct before the NMOS transistors turn on. Consequently, undesirable performance characteristics which might otherwise result are prevented.

FIG. 1 shows a portion of a CMOS device 10 in which a Schottky diode 12 is fabricated. Those skilled in the art will recognize that FIG. 1 shows only a small portion of device 10, and that device 10 may include a multiplicity of NMOS, PMOS, and Schottky devices. However, the FIGURES only show the fabrication of a single PMOS field effect transistor 14 and an NMOS field effect transistor 16 residing on opposing sides of Schottky diode 12. The same process steps applied to diode 12 and MOS devices 14-16 apply to all such devices in semiconductor device 10. Moreover, those skilled in the art will recognize that references to Schottky diode 12 and transistors 14-16 in the early stages of fabrication refer to the sections in device 10 at which Schottky diode 12 and transistors 14-16 are being fabricated.

At a first stage of fabrication, as shown in FIG. 1, a monocrystalline silicon substrate 18 is generally doped to exhibit P+ characteristics. The preferred process grows a P− monocrystalline epitaxial layer 20 in a conventional manner overlying substrate 18. Next, the process forms an N− well region 22 for PMOS transistor 14, an N− well region 24 for Schottky diode 12, and a P well region 26 for NMOS transistor 16. In addition, the process of the present invention forms a P junction isolation well region 28 between N− well regions 22 and 24. Well regions 24 and 26 reside adjacent to each other Well regions 22-28 are implanted and driven in using conventional techniques. Each of well regions 22-28 may advantageously have a dopant concentration in the range of 8E15 to 4E16 atoms/cm$^3$ or more. As shown in FIG. 1, junction isolation well 28 may be significantly smaller than wells 22-26 since an active device is not to be formed in well 28. In the preferred embodiment, each of wells 22-28 are driven in to a depth of as much as 1-2 microns.

Furthermore, field oxide regions 30 reside at a semiconductor surface 32 of device 10. Semiconductor surface 32 represents the surface of device 10 at which well regions 22-28 are formed. Moreover, field oxide regions 30 reside on surface 32 at the boundaries between the various ones of N and P well regions 22-28. As can be seen in FIG. 1, one of field oxide regions 30 completely overlies junction isolation well region 28.

Consequently, the process of the present invention forms N− well 24 for Schottky diode 12 without using additional process steps because well 24 is formed simultaneously with N− well 22 for PMOS transistor 14. The preferred embodiment forms Schottky diode 12 in an N− well because, in the preferred embodiment, P+ substrate 18 is grounded. Consequently, a P well, such as P well 26 must only experience voltages near the ground voltage level. Since Schottky diode 12 resides in an N—well, a wide range of voltages may be tolerated and more flexibility is provided to circuit designers in the use of Schottky diode 12. However, nothing prevents the formation of Schottky diode 12 in a P well.

FIG. 2 shows a second stage in the fabrication of device 10. The structure shown in FIG. 2 generally results from growing a gate oxide 34 over the entirety of surface 32 and the performance of subsequent process steps. The present process typically grows gate oxide 34 to a thickness of around 350 angstroms or less. Next, the process calls for depositing a polycrystalline silicon (poly) layer 36 over the entirety of gate oxide 34. The deposition of poly layer 36 utilizes conventional LPCVD deposition techniques. Typically, the process of the preferred embodiment deposits poly layer 36 to a thickness of around 4,500 angstroms. Next, the process patterns and etches poly layer 36 to form gates 38 and a spacer 40. One of gates 38 resides in each of PMOS transistor 14 and NMOS transistor 16, and spacer 40 resides in Schottky diode 12. The process uses a conventional anisotropic, selective, chemical etching step that removes portions of poly layer 36 without removing a significant portion of gate oxide 34. Each of gates 38 and spacer 40 are formed to exhibit a minimum photolithographically achievable limit, which is around 0.8 microns in the preferred embodiment. Consequently, those skilled in the art will understand that there is substantially no structural difference between spacer 40 and gates 38, and that spacer 40 could serve as a gate if a MOS transistor, rather than Schottky diode 12, were to be formed in well 24.

Although not explicitly illustrated in FIG. 2, the process of the present invention may optionally implant lightly doped drains, or reachthroughs, at this point in the process. Such lightly doped drains serve no function for Schottky diode 12. Therefore, masks (not shown) used in connection with implanting such lightly doped drains may advantageously extend to cover Schottky diode 12 so that no implantation occurs in Schottky diode 12. No additional steps are required to mask-off Schottky diode 12 because such masking steps are required in the fabrication of PMOS transistor 14 and NMOS transistor 16.

Subsequent to the formation of gates 38 and spacer 40, the process of the present invention deposits a TEOS oxide layer 42 over the entirety of device 10. The present process typically deposits layer 42 to a thickness which is around 2300 angstroms thick. Next, a conventional anisotropic etching process removes most of TEOS layer 42 and a portion of gate oxide 34 to form sidewall oxides 44 from the remaining portions. Sidewall oxides 44 reside overlying gate oxide 34, adjacent to gates 38 and spacer 40. This anisotropic etching process uses silicon at surface 32 and at poly layer 36 as an etch stop. A well controlled lateral width at the lower portions of sidewall oxides 44 results. In the preferred embodiment, sidewall oxides 44 are each around 1,800-2,000 angstroms wide at the lower portions thereof.

The structure generally shown in FIG. 2 results from the above-described process steps. Accordingly, the structure shown in FIG. 2 associated with Schottky diode 12 does not significantly differ from the structure formed in connection with PMOS and NMOS transistors 14 and 16, respectively. Thus, no additional process steps are required in the construction of Schottky diode 12. Moreover, since each of gates 38 and spacer 40 has a width determined by minimum photolithographically realizable limits, the width of spacer 40 in connection with accompanying sidewall oxides 44 is minimized. This provides an advantage in Schottky diode 12 because it minimizes series resistance due to the N− region between the Schottky contact and N+ ohmic contact. Moreover, the width of sidewall oxides 44 and spacer 40 could be comparable to the thickness of an epitaxial layer of a bipolar device. Consequently, series resistance for Schottky diode 12 need not be greater, and may be less, than series resistance for a corresponding vertically oriented Schottky diode fabricated in a bipolar device. Still further, the widths obtainable from spacer 40 in conjunction with the associated ones of sidewall oxides 44 are relatively consistent from diode to diode within device 10 due to the photolithographic techniques and anisotropic etching techniques which define this width Thus, series resistance remains constant from diode to diode within device 10.

FIG. 3 shows semiconductor device 10 at a third stage of fabrication. The FIG. 3 structure results from forming a thin oxide layer 46 over the entire surface of semiconductor device 10. Oxide layer 46 prevents channeling during subsequent ion implantation steps and protects the surface from contamination. The present process typically deposits around a 300 angstrom thick layer of TEOS oxide for oxide layer 46. After the formation of oxide layer 46, the present process applies and develops a photoresist mask 48 so that solid portions of mask 48 overlie an anode section 49 of Schottky diode 12 and the entirety of PMOS transistor 14. Conversely, a void portion of mask 48 (i.e. no photoresist material) overlies NMOS transistor 16 and a cathode section 50 of Schottky diode 12. A junction 51 between solid and void portions of mask 48 resides centrally located on top of spacer 40. However, the precise location of junction 51 is not critical in the preferred embodiment of the present invention and may reside anywhere on spacer 40. Photoresist 48 is a conventional photoresist applied using conventional techniques to a thickness that is sufficient in the solid portions thereof to prevent transmission of ions therethrough during a subsequent implantation step.

This implantation step occurs next. The process of the present invention implants an N conductivity type dopant, such as arsenic, phosphorous, or both, into device 10 through the void regions of mask 48 and exposed portions of dummy oxide 46. However, the energy level of this implantation step is sufficiently low so that substantially all ions impacting field oxide 30, gate 38, spacer 40, and sidewall oxides 44 are consumed therein. Consequently, N+ regions 52 and 53 at surface 32 in N−well 24 and P well 26, respectively, result. Subsequent annealing steps drive in N+ region 52 to form a cathode for Schottky diode 12 and drive in N+ regions 53 to form a source and a drain for NMOS transistor 16. The concentration of N+ dopant in cathode region 52 needs to be sufficiently high so that an ohmic junction forms when an overlying metal contacts region 52. Conventionally used N+ dopant concentrations for source and drain regions of NMOS transistors are acceptable for region 52 in Schottky diode 12. Consequently, the cathode for Schottky diode 12 results from the same process steps which form the source and drain regions of NMOS transistor 16.

FIG. 4 shows a fourth stage in the fabrication of device 10. The structure shown in FIG. 4 results from stripping photoresist mask 48 from the structure shown in FIG. 3 and subsequent process steps. Next, the process of the present invention applies and develops a photoresist mask 54. Photoresist mask 54 contains solid portions over NMOS transistor 16 and cathode section 50 of Schottky diode 12. In addition, the solid portion of mask 54 overlies the central portion of anode section 49 of Schottky diode 12. Void regions of mask 54 exist over the entirety of PMOS transistor 14 and the edge portions of anode section 49 of Schottky diode 12. In other words, mask 54 exposes a small portion of oxide layer 46 in anode section 49 of Schottky diode 12. FIG. 4 shows one part of this small exposed portion residing near to spacer 40 and a sidewall oxide 44, and another part residing near to a field oxide region 30.

After the application and development of mask 54, a conventional ion implantation step implants a P conductivity type dopant, such as boron, through the void portions of mask 54 and through dummy oxide 46 into device 10. The energy used in this implantation step is sufficiently low that solid portions of mask 54, field oxide 30, spacer 40, gate 38, and sidewall oxides 44 substantially consume implanted ions therein. Consequently, epitaxial layer 20 of device 10 receives the P type dopant only in areas at which oxide layer 46 is exposed. This implantation step produces P+ regions 56 and 58. One of P+ regions 56 resides on one side of gate 38 in PMOS transistor 14 and serves as one of a source or drain for PMOS transistor 14. Another one of P+ regions 56 resides in PMOS transistor 14 at an opposing side of gate 38 and serves as the other of the source and drain for PMOS transistor 14. P+ region 58 forms a guard ring 60 for Schottky diode 12. The cross-sectional side view shown in FIG. 4 depicts two portions of guard ring 60.

Consequently, the present process forms guard ring 60 for Schottky diode 12 using process steps necessary in forming P+ source and drain implants for PMOS transistor 14. No additional process steps are required. Guard ring 60 is advantageous in Schottky diode 12 to prevent edge leakage of a resulting Schottky junction. Moreover, the concentration levels used in the implantation of the P+ dopant are not critical for the function of guard ring 60 in Schottky diode 12. These concentrations are merely sufficiently high to make an ohmic contact between a subsequently applied overlying metal layer and guard ring 60. Conventionally used concentrations for P+ source and drain implants in PMOS devices are sufficient for the purposes of guard ring 60.

As shown in FIG. 4, guard ring 60 occupies a relatively narrow area in Schottky diode 12. Those skilled in the art may recognize that anode section 49 of Schottky diode 12 may be expanded to permit a slight misalignment capability in the application of mask 54 and to improve the reliability of guard ring 60. However, those skilled in the art will additionally recognize that guard ring 60 is a desirable but not a necessary feature in the construction of Schottky diodes. Consequently, as an alternative embodiment, mask 54 may entirely cover Schottky diode 12 so that guard ring 60 is not formed. No additional process steps would result from these modifications.

FIG. 5 shows a top view of device 10 at a fifth stage of fabrication. Moreover, FIG. 5 depicts only Schottky diode 12 from device 10. The structure shown in FIG. 5 results from using conventional techniques to strip photoresist mask 54 and oxide layer 46 from the structure shown in FIG. 4. As shown in FIG. 5, N+ cathode region 52 resides along one side of spacer 40. A structure consisting of guard ring 60 and N− well 24 reside along an opposing side of spacer 40. Guard ring 60 completely surrounds N− well 24. In addition, field oxide 30 completely surrounds spacer 40, N+ cathode region 52, and guard ring 60. It is N− region 24 as shown in FIG. 5 which forms a rectifying junction when a metallic layer is subsequently applied, and N+ region 52 which forms an ohmic junction. Regions 24 and 52 are spaced apart by spacer 40. Those skilled in the art will recognize that Schottky diode 12 may take alternative geometrical shapes. One such alternative shape may be a set of concentric rings. For example, a circular N+ outer ring may surround an intermediate spacer ring which in turn surrounds an innermost circular N− region. This alternative structure is similar to the structure shown in FIG. 5 because the N− innermost circular region would be spaced apart from the N+ outer ring by the intermediate spacer ring.

FIG. 6 shows a cross-sectional side view of device 10 at a sixth stage of fabrication. The preferred process of the present invention sputter deposits a refractory metal, such as titanium, (not shown) to a thickness of around 900 angstroms over the entire surface of device 10. Next, this refractory metal is reacted with silicon wherever it overlies and contacts silicon on device 10. This reacting step may advantageously be performed in a nitrogen environment at temperatures greater than 600° C. for at least 30 minutes. After the refractory metal has reacted with silicon, unreacted metal is removed, and device 10 may undergo additional annealing of the silicide formed thereby to lower its resistivity The structure shown in FIG. 6 results.

Thus, FIG. 6 shows a silicide 62 overlying each of poly gates 38 and poly spacer 40. Moreover, silicide 62 overlies source and drain regions 53 and 56 of NMOS transistor 16 and PMOS transistor 14, respectively. In addition, silicide 62 overlies N+ cathode region 52 of Schottky diode 12, and N− well 24 in anode section 49 of Schottky diode 12. In the preferred embodiment, silicide layer 62 is approximately 1,500 angstroms thick. As discussed above, the metal silicide to N+ boundary which occurs between silicide 62 and N+ cathode region 52 forms an ohmic junction, and the metal silicide to N− boundary which occurs between silicide 62 and N− well 24 forms a rectifying junction. Silicide layer 62 is formed in PMOS transistor 14 and NMOS transistor 16 to lower resistance of source and drain regions and to lower a contact resistance between an overlying contact and these regions. Consequently, the silicide, which is a metal, is applied to Schottky diode 12 without additional steps in a conventional CMOS process.

Conventional subsequent processing steps (not shown) may advantageously apply a TEOS oxide layer over device 10 and a phospho silicate glass layer over the TEOS layer. Next, processing steps will form holes through such TEOS oxide and glass layers for contacts to silicide 62 at sources, drains, gates, anodes and cathodes of transistors 14 and 16 and Schottky diode 12. A metallization step will occur next, followed by a patterning and etching step. Finally, finishing passivation layers may be applied to device 10 to complete an integrated circuit. Conductive layers may advantageously either refrain from contacting silicide 62 overlying spacer 40 or electrically couple spacer 40 to a convenient common potential because spacer 40 serves no direct electrical function in Schottky diode 12.

Consequently, the present invention provides a laterally oriented Schottky diode 12 which easily conforms to a conventional CMOS process. In fact, Schottky diode 12 may be fabricated without additional steps specifically dedicated to the fabrication of Schottky diode 12. Moreover, electrical parameters of Schottky diode 12 in the present invention are desirable because series resistance is both minimized and held substantially constant between various Schottky diodes in device 10, and peripheral leakage currents are minimized through the use of guard ring 60.

The present invention has been described above with reference to preferred embodiments. However, those skilled in the art will recognize that changes and modifications may be made in these preferred embodiments without departing from the scope of the present invention. For example, the laterally oriented Schottky diode described herein need not be limited to CMOS processes, but may be adapted to PMOS or NMOS processes with little or no added complication. Moreover, nothing prevents the above-described laterally oriented diode from being used in connection with bipolar, BiCMOS, or other semiconductor processes. In addition, those skilled in the art will recognize that various substitutions may occur to the above-described structure and process. For example, polycrystalline silicon spacer 40 serves no direct electrical function in the present invention and could be replaced by, for example, a TEOS oxide layer which is patterned and etched to form a spacer. Moreover, those skilled in the art will recognize that the specific dimensions, concentrations, dopants, and the like which are described above are subject to modification. These and other changes and modifications which are obvious to those skilled in the art are intended to be included within the scope of the present invention.

What is claimed is:

1. A method of manufacturing a metal-semiconductor diode in a substrate having semiconducting surface areas thereon, said method comprising the steps of:
   forming a well region in said substrate at one of said surface areas, said well region containing a first conductivity type dopant at a first level of concentration;
   forming a spacer on said substrate overlying a portion of said well region;
   forming a first mask layer overall;
   removing selected portions of said first mask layer to expose a first edge of said spacer and a portion of the well region adjacent to said first edge of said spacer;
   forming an ohmic contact region in said portion of said well region exposed by said first mask layer, said ohmic contact region containing a first conductivity type dopant at a second level of concentration, said second level of concentration being greater than said first level of concentration;
   forming a metallic layer overlying and in contact with a portion of said well region adjacent to a second side of said spacer, said second side opposing said first side, a boundary between said metallic layer and said well region being a rectifying junction.

2. A method as claimed in claim 1 additionally comprising the steps of:
   forming a second mask layer overall;
   removing selected portions of said second mask layer to expose said second side of said spacer and a portion of said well region adjacent to said second side of said spacer, said portion of said well region exposed by said second mask layer surrounding said rectifying junction;
   forming a guard ring region in said portion of the well region exposed by said second mask layer, said guard ring region containing a second conductivity type dopant at a third level of concentration, said third level of concentration being greater than said first level of concentration.

3. A method as claimed in claim 1 wherein said forming a metallic layer step comprises the step of forming a silicide, said silicide additionally being formed at said one surface area overlying said ohmic contact region.

4. A method as claimed in claim 1 wherein said forming a spacer comprises the steps of forming a polycrystalline silicon electrode, depositing an insulator thereon, and anisotropically etching the insulator to form sidewall oxides adjacent to the polycrystalline silicon electrode.

5. A method as claimed in claim 1 wherein said forming a spacer comprises the step of forming a silicon oxide.

6. A method as claimed in claim 1 wherein said step of forming an ohmic contact region comprises implanting a dopant of said first conductivity type at said second level of concentration through said exposed portion of said first mask layer and aligned with said first side of said spacer.

7. A method of fabricating a MOS apparatus having a Schottky diode, said apparatus being fabricated in a substrate having semiconducting surface areas thereon, and said method comprising the steps of:

forming first and second well regions in said substrate at one of said surface areas, said first well region containing a first dopant of a first conductivity type at a first level of concentration and said second well region containing a first dopant of a second conductivity type at a second level of concentration;

forming first and second conducting regions overlying portions of said first and second well regions, respectively, said first conducting region serving as a spacer in said Schottky diode, and said second conducting region serving as a gate in a MOS transistor;

introducing a second dopant of said first conductivity type into said first and second well regions, said second dopant being introduced at a third level of concentration which is greater than said first level of concentration on first and second opposing sides of said second conducting region to form source and drain regions for said MOS transistor and on a first side of said first conducting region to form one of an anode and a cathode for said Schottky diode;

forming a metallic layer overlying said first well region on a second side of said first conducting region, said first conducting region first side opposing said first conducting region second side, and a boundary between said metallic layer and said well region forming a rectifying junction for said Schottky diode.

8. A method as claimed in claim 7 additionally comprising the steps of:

forming a third well region in said substrate at said one surface area, said third well region containing said first dopant of said first conductivity type at said first level of concentration;

forming a third conducting region overlying a portion of said third well region, said third conducting region serving as a gate in a second MOS transistor;

introducing a second dopant of said second conductivity type into said third well region, said second dopant being introduced at a fourth level of concentration which is greater than said second level of concentration on first and second opposing sides of said third conducting region to form source and drain regions for said second MOS transistor.

9. A method as claimed in claim 7 wherein said introducing a second dopant of said second conductivity type step additionally introduces said second dopant of said second conductivity type into said first well region on said second side of said first conducting region to form a guard ring region for said rectifying junction for said Schottky diode.

10. A method as claimed in claim 7 wherein said forming a metallic layer step additionally forms a metallic layer overlying said second dopant in said second well region.

11. A method as claimed in claim 7 additionally comprising the step of selecting said first conductivity type to be N type and said second conductivity type to be P type.

12. A method as claimed in claim 7 wherein said forming a metallic layer step comprises the step of forming a silicide.

* * * * *